United States Patent
Nam

(10) Patent No.: US 9,565,763 B2
(45) Date of Patent: Feb. 7, 2017

(54) PRINTED CIRCUIT BOARDS HAVING SUPPORTING PATTERNS AND METHOD OF FABRICATING THE SAME

(71) Applicant: SK hynix Inc., Icheon-si Gyeonggi-do (KR)

(72) Inventor: Jong Hyun Nam, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/885,318

(22) Filed: Oct. 16, 2015

(65) Prior Publication Data

US 2016/0316561 A1    Oct. 27, 2016

(30) Foreign Application Priority Data

Apr. 23, 2015   (KR) .......................... 10-2015-0057563

(51) Int. Cl.
| | |
|---|---|
| *H05K 1/11* | (2006.01) |
| *H05K 1/02* | (2006.01) |
| *H05K 3/46* | (2006.01) |
| *H05K 3/40* | (2006.01) |

(52) U.S. Cl.
CPC ............ *H05K 1/113* (2013.01); *H05K 1/0298* (2013.01); *H05K 3/4038* (2013.01); *H05K 3/4623* (2013.01); *H05K 3/4652* (2013.01); *H05K 2201/0355* (2013.01); *H05K 2203/0562* (2013.01)

(58) Field of Classification Search
USPC ....................................................... 174/262
See application file for complete search history.

(56) References Cited

U.S. PATENT DOCUMENTS

| | | | | |
|---|---|---|---|---|
| 5,372,872 A | * | 12/1994 | Funada ................. | H05K 3/462 428/210 |
| 7,368,819 B2 | * | 5/2008 | Sawada ............. | H01L 23/49816 257/689 |
| 2001/0013425 A1 | * | 8/2001 | Rokugawa ........ | H01L 23/49811 174/262 |
| 2009/0140426 A1 | * | 6/2009 | Lee ......................... | H01L 24/16 257/741 |

FOREIGN PATENT DOCUMENTS

KR    1020090121163 A    11/2009

* cited by examiner

*Primary Examiner* — Timothy Thompson
*Assistant Examiner* — Michael F McAllister
(74) *Attorney, Agent, or Firm* — William Park & Associates Ltd.

(57) ABSTRACT

A printed circuit board includes an inner layer having a supporting pattern and via pad patterns that are disposed to be spaced apart from each other in a lateral direction, an outer layer disposed over or below the inner layer and including a circuit pattern, a via plug connecting the circuit pattern layer to any one of the via pad patterns. The supporting pattern is stiffer than the via pad patterns, and at least two of the via pad patterns are electrically connected to each other by a via pad connecting pattern located at substantially the same level as the via pad patterns.

11 Claims, 16 Drawing Sheets

PRINTED CIRCUIT BOARDS HAVING SUPPORTING PATTERNS AND METHOD OF FABRICATING THE SAME

CROSS-REFERENCE TO RELATED APPLICATION

The present application claims priority under 35 U.S.C. 119(a) to Korean Application No. 10-2015-0057563, filed on Apr. 23, 2015, in the Korean Intellectual Property Office, which is incorporated herein by reference in its entirety as set forth in full.

BACKGROUND

1. Technical Field

Various embodiments of the present disclosure generally relate to printed circuit boards (PCBs) and, more particularly, to PCBs having supporting patterns and method of fabricating the same.

2. Related Art

Recently, because of the tendencies towards f light, slim, short and small package products, processing technologies for reducing a thickness of the PCB and miniaturizing the PCB have been studied. One of these processing technologies is about lamination technology using a carrier substrate. Specifically, after preparing a carrier substrate, a lamination structure is formed. The lamination structure is formed by forming a plurality of circuit pattern layers and insulation layers on the carrier substrate. Then, a thin PCB having the circuit pattern layers and the insulation layers is formed by removing the carrier substrate from the lamination structure. The manufacturing techniques employing the removable carrier substrate have been noted in the related fields because it can reduce the thickness of the PCB. This is in contrast with the general technology in which the circuit patterns are directly implemented on a copper clad laminate (CCL) substrate. On the other hand, despite the advent of the technique utilizing the above-mentioned carrier substrate, new technologies used for fabricating a thin PCB with greater reliability are increasingly in demand.

SUMMARY

According to an embodiment, there may be provided a printed circuit board (PCB). The PCB may include an inner layer having a supporting pattern and via pad patterns that are disposed to be spaced apart from each other in a lateral direction. The PCB may include an outer layer disposed over or below the inner layer and including a circuit pattern, and a via plug connecting the circuit pattern layer to any one of the via pad patterns. The supporting pattern may be stiffer than the via pad patterns, and at least two of the via pad patterns may be electrically connected to each other by a via pad connecting pattern located at substantially the same level as the via pad patterns.

According to an embodiment, there may be provided a method of fabricating a printed circuit board (PCB). The method may include providing a first intermediate substrate having an insulating core layer and a via pad pattern disposed on a surface of the insulating core layer. The method may include providing a supporting substrate including a hole pattern corresponding to the via pad pattern, and providing a second intermediate substrate including an insulating layer. The first intermediate substrate, the supporting substrate and the second intermediate substrate may be combined with each other so that the supporting substrate is disposed between the first and second intermediate substrates. The via pad pattern may be disposed inside the hole pattern, and the via pad pattern and the supporting substrate may be spaced apart from each other on the same plane.

According to an embodiment, there may be provided an electronic system including a printed circuit board (PCB). The PCB may include an inner layer having a supporting pattern and via pad patterns disposed and spaced apart from each other in a lateral direction. The PCB may include an outer layer disposed over or below the inner layer and including a circuit pattern, and a via plug configured to connect the circuit pattern layer to any one of the via pad patterns. The supporting pattern may be stiffer than the via pad patterns, and at least two of the via pad patterns may be electrically connected to each other by a via pad connecting pattern located at substantially the same level as the via pad patterns.

According to an embodiment, there may be provided a memory card including a printed circuit board (PCB). The PCB may include an inner layer having a supporting pattern and via pad patterns disposed and spaced apart from each other in a lateral direction. The PCB may include an outer layer disposed over or below the inner layer and including a circuit pattern, and a via plug configured to connect the circuit pattern layer to any one of the via pad patterns. The supporting pattern may be stiffer than the via pad patterns, and at least two of the via pad patterns may be electrically connected to each other by a via pad connecting pattern located at substantially the same level as the via pad patterns.

DETAILED DESCRIPTION

Figure 1:
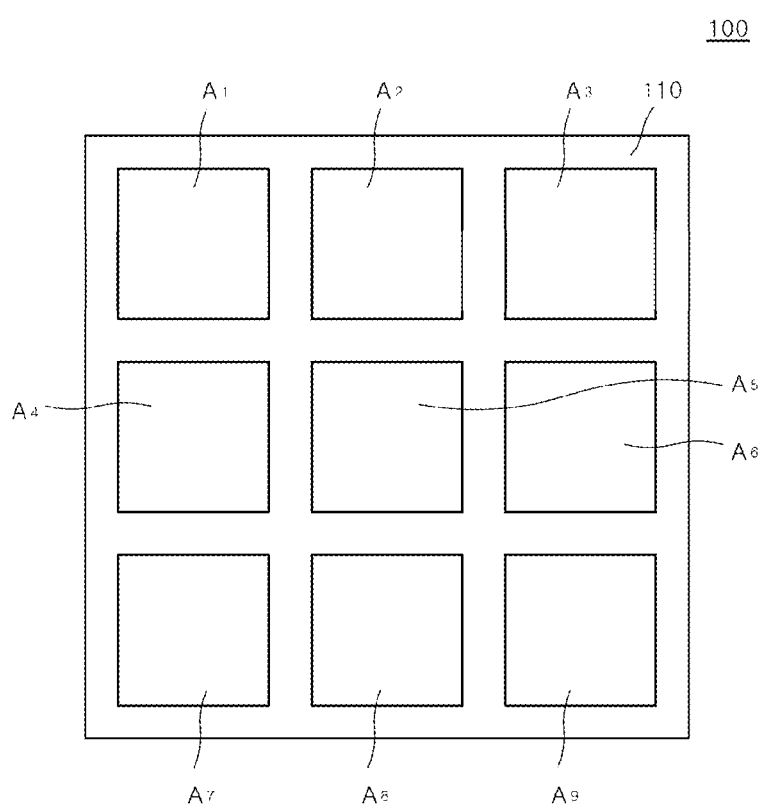
FIG. 1 is a schematic view illustrating a representation of an example of a PCB including a plurality of unit substrates according to an embodiment.

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the present disclosure to those skilled in the art. In the drawings, the dimensions of layers and regions may be exaggerated for clarity of illustration. Overall, the drawings were described in the observer's view point. It will also be understood that when an element is referred to as being located "on", "over", "above", "under", "beneath" or "below" another element, it may directly contact the other element, or at least one intervening element may be present therebetween.

Same reference numerals refer to same elements throughout the drawings. Also, in the specification, the singular terms "a," "an" and "the" are intended to include the plural forms as well, unless the context clearly indicates otherwise. It will be further understood that the term "include" or "have" specify the presence of stated features, integers, steps, operations, elements, and/or components, but does not preclude the presence and/or addition of one or more other features, integers, steps, operations, elements, components, and/or groups thereof.

In addition, carrying out the method or the fabricating method, each step constituting the method may be performed in a different order stated unless explicitly described to a certain sequence context. That is, each process may also performed in the same manner as specified order and may be performed substantially simultaneously, and the case in which may be performed in the reverse order is not excluded.

Generally, semiconductor chips or semiconductor packages related to various electronic devices can be mounted on a surface of the PCB or inside the PCB. The PCB may exchange electrical signals with the semiconductor chips or the semiconductor packages through interconnection means such as bumps or wires and, can supply electrical power from the external systems to the semiconductor chips or the semiconductor packages. These PCBs may be fabricated as an aggregate of a plurality of unit substrates according to the specification rule of the products or request of customer.

Various embodiments may be directed to printed circuit boards having supporting patterns and methods of fabricating the same, memory cards including the printed circuit board, and electronic systems including the same.

FIG. 1 is a schematic view illustrating a PCB 100 including a plurality of unit substrates according to an embodiment. Referring to FIG. 1, the PCB 100 may include a plurality of unit substrates A1-A9 and a frame portion 110 disposed between the unit substrates A1-A9. In the drawing, as an embodiment, although it is illustrated that the PCB 100 has a stripe form and includes nine unit substrates A1-A9, the present disclosure is not limited thereto. The PCB 100 may have one of various forms, and the number of the unit substrates included in the PCB 100 may be less or greater than nine.

A semiconductor chip (not illustrated) may be mounted on a portion of each of the unit substrates A1-A9. In addition, each of the unit substrates A1-A9 may include circuit pattern layers for driving of the semiconductor chip. The frame portion 110 may include auxiliary patterns such as electrode patterns used when the circuit pattern layers are formed by a plating process and such as electrical test patterns used to verify whether the circuit pattern layers operate normally. Finally, the unit substrates A1-A9 on which the semiconductor chips are mounted may be separated from each other to realize a plurality of separate unit packages.

Figure 2:
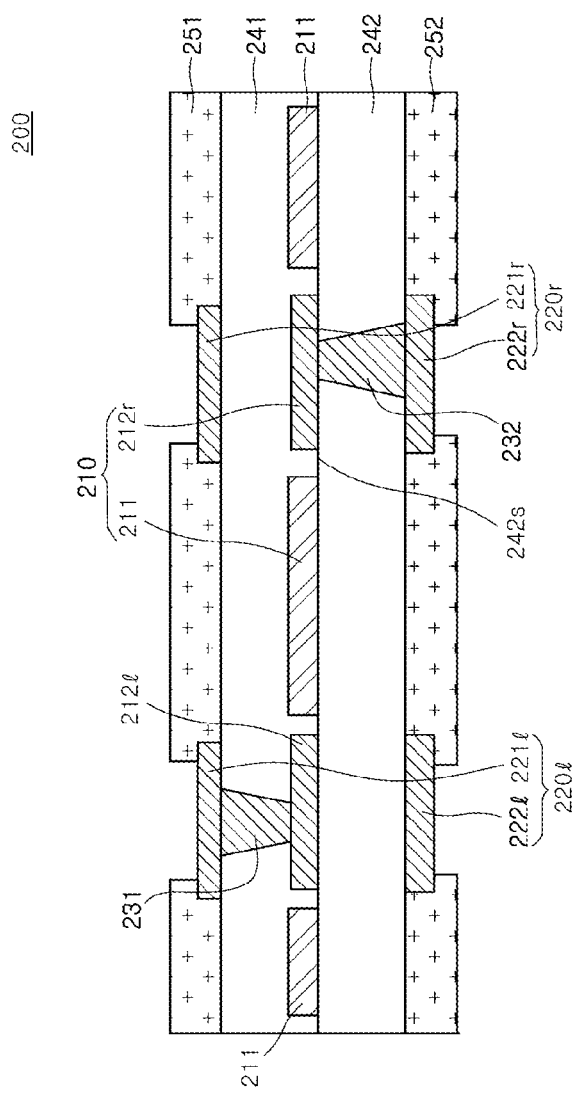
FIG. 2 is a cross-sectional view illustrating a representation of an example of a PCB according to an embodiment.

FIG. 2 is a cross-sectional view illustrating a PCB 200 according to an embodiment. The PCB 200 illustrated in FIG. 2 may be one of the unit substrates A1-A9 illustrated in FIG. 1 or a part of the frame portion 110 illustrated in FIG. 1. Referring to FIG. 2, the PCB 200 may include an inner layer 210 having supporting patterns 211 and via pad patterns 212*l* and 212*r*, outer layers 220*l* and 220*r* disposed on or below the inner layer 210 to comprise first and second circuit pattern layers 221*l*, 221*r*, 2221 and 222*r*, and first and second via plugs 231 and 232 connecting the circuit pattern layers 221*l* and 221*r* to the via pad patterns 212*l* and 212*r*. The supporting patterns 211 and the via pad patterns 212*l* and 212*r* may be disposed to be spaced apart from each other and may be electrically insulated from each other. The PCB 200 may include first and second interlayer dielectric layers 241 and 242 disposed between the inner layer 210 and the outer layers 220*l* and 220*r*. First and second resist pattern layers 251 and 252 selectively exposing the first and second circuit pattern payers 221*l*, 221*r*, 222*l* and 222*r* may be disposed on the first and second interlayer dielectric layers 241 and 242, respectively. The supporting patterns 211 may be disposed to be spaced apart from the via pad patterns 212*l* and 212*r* in the lateral direction on the same plane. The first interlayer dielectric layer 241 may be disposed between the supporting patterns 211 and the via pad patterns 212*l* and 212*r* spaced apart from the supporting patterns 211. The supporting patterns 211 and the via pad patterns 212*l* and 212*r* may be disposed on a surface 242*s* of the second interlayer dielectric layer 242.

The supporting patterns 211 may have a relatively greater stiffness as compared with the via pad patterns 212*l* and 212*r*. In an embodiment, the supporting patterns 211 may include a material which is stiffer than the via pad patterns 212*l* and 212*r*. For example, if the via pad patterns 212*l* and 212*r* are copper (Cu) plating layers, the supporting patterns 211 may include an alloy steel material or a ceramic material. The alloy steel material may be a carbon steel material or a stainless steel material, and the ceramic material may be a metal oxide type material. Accordingly, the supporting patterns 211 may have a greater stiffness than the via pad patterns 212*l* and 212*r*. In an embodiment, the supporting patterns 211 may include the same material as the via pad patterns 212*l* and 212*r* and may be thicker than the via pad pattern 212*l* and 212*r*. Top surfaces of the supporting patterns 211 may be located at a level which is higher than top surfaces of the via pad patterns 212*l* and 212*r*, on the second interlayer dielectric layer 242. In this way, even though the supporting patterns 211 include the same material as the via pad patterns 212*l* and 212*r*, the supporting patterns 211 may have a greater stiffness than the via pad patterns 212*l* and 212*r* because a thickness of the supporting patterns 211 is greater than a thickness of the via pad patterns 212*l* and 212*r*. The supporting patterns 211 having a relatively greater stiffness may structurally support the inner layer 210. By doing this, it may be possible to prevent the inner layer 210 from being bent or oscillating while the PCB 200 is fabricated. As a result, it may be possible to prevent the substrate from being damaged and the reliability of the PCB from being lowered.

The via pad patterns 212*l* and 212*r* may be circular pads or polygonal pads in a plan view. Different via pad patterns 212*l* and 212*r* may be electrically connected to each other through a via pad connecting pattern (not illustrated) disposed in the inner layer 210. The via connecting pattern may be a line pattern having a predetermined width or a regional pattern having an arbitrary shape. The via pad pattern 212*l* may be connected to the first circuit pattern 221*l* of the outer layer 220*l* through the first via plug 231. The via pad pattern 212*r* may be connected to the second circuit pattern 222*r* of the outer layer 220*r* through a second via plug 232. The first via plug 231 or the second via plug 232 may be a blind via layer. The via pad patterns 212*l* and 212*r* may be electrically coupled to each other by the via pad connecting pattern. In this example, the first circuit pattern layer 221*l*, the first via plug 231, the via pad pattern 212*l*, the via pad connecting pattern, the via pad pattern 212*r*, the second via plug 232, and the second circuit pattern layer 222*r* may be electrically connected to each other to constitute an electrical signal transmission path.

Although not illustrated in the drawing, in an embodiment, the first via plug 231 may be vertically aligned with the second via plug 232 and may contact the upper surface of the via pad pattern 212*r* and the lower surface of the first circuit pattern layer 221*r*. In this example, the first circuit pattern layer 221*r*, the first via plug 231, the via pad pattern 212*r*, the second via plug 232 and the second circuit pattern layer 222*r* may be electrically connected to each other to constitute a vertical signal transmission path.

On the other hand, although FIG. 2 illustrates an example in which the PCB 200 includes a single inner layer and two outer layers, the present disclosure is not limited thereto. For example, in some other embodiments, the PCB 200 may include two or more inner layers.

Figure 3A:
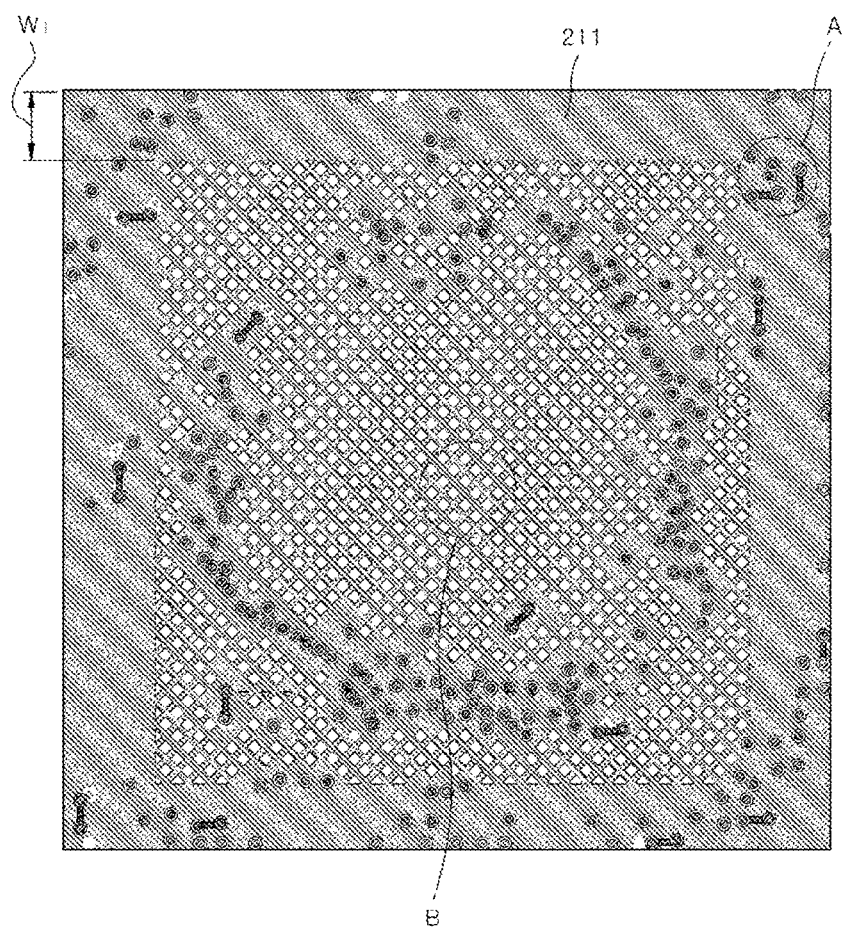
FIG. 3A is a perspective plan view schematically illustrating a representation of an example of an inner layer of a PCB according to an embodiment.
Figure 3B:
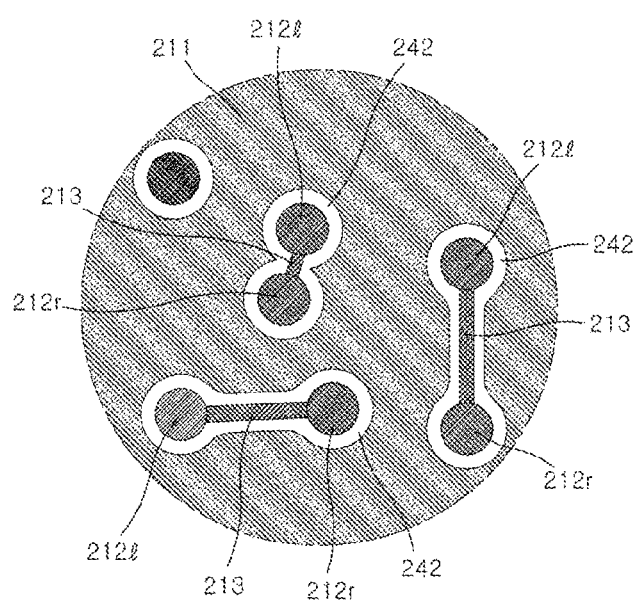
FIG. 3B is an enlarged view of a representation of an example of a region "A" of FIG. 3A.
Figure 3C:
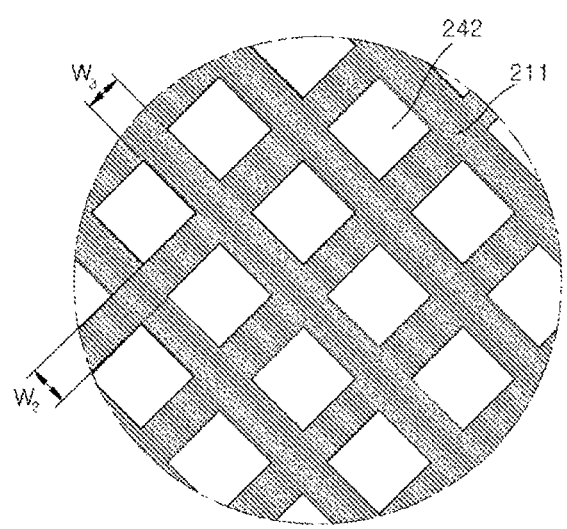
FIG. 3C is an enlarged view of a representation of an example of a region "B" of FIG. 3A.

FIG. 3A is a perspective plan view schematically illustrating an inner layer of a PCB according to an embodiment. FIG. 3B is an enlarged view of a region "A" in FIG. 3A, and FIG. 3C is an enlarged view of a region "B" in FIG. 3A. FIGS. 3A to 3C may be perspective plan views of any one (e.g., the unit substrate A1) of the unit substrates A1-A9 illustrated in FIG. 1.

Referring to FIGS. 3A and 3B, the supporting pattern 211 may be a regional pattern having a stripe shape surrounding the edges of the unit substrate A1 and has a predetermined width W1. Alternatively, the supporting pattern 211 may be a regional pattern in an arbitrary closed loop. Referring to FIGS. 3A and 3C, the supporting pattern 211 may be a grid pattern consisting of lines that intersect each other and have predetermined widths W2 and W3. The via pad patterns 212*l* and 212*r* may be disposed inside the regional pattern of the stripe shape or may be disposed inside the regional pattern in the arbitrary closed loop. The via pad patterns 212*l* and 212*r* may be disposed to be spaced apart from the supporting pattern 211 and may be electrically insulated from the supporting pattern 211 by the first interlayer dielectric layer 241. At least two of the via pad patterns 212*l* and 212*r* may be connected to each other by the via pad connecting patterns 213 located at the same level as the via pad patterns 212*l* and 212*r*. The via pad connecting patterns 213 may have the same material or the same thickness as the via pad patterns 212*l* and 212*r*. For example, the via pad connecting patterns 213 may be copper (Cu) layers. The via pad connecting patterns 213 may be electrically insulated from the supporting pattern 211 by the first interlayer dielectric layer 241.

Figure 4:
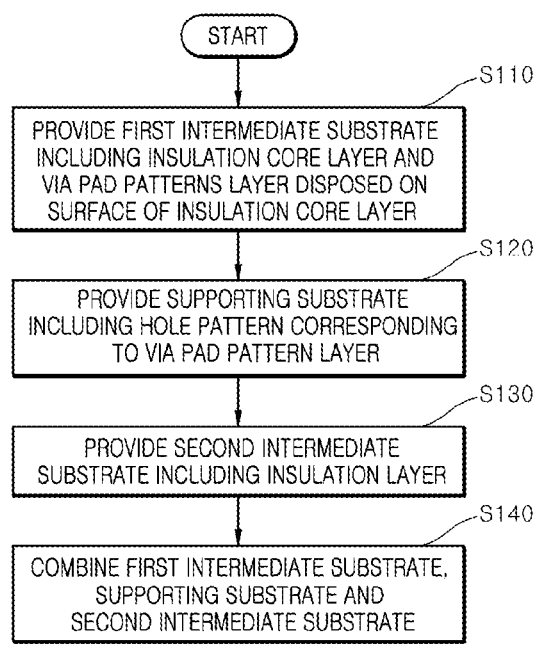
FIG. 4 is a flow chart illustrating a representation of an example of a method of fabricating a PCB according to an embodiment.

FIG. 4 is a flow chart illustrating a method of fabricating a PCB according to an embodiment.

Referring to FIG. 4, a first intermediate substrate including an insulating core layer may be provided. The first intermediate substrate may further include via pad patterns and via pad connecting patterns disposed on the insulating core layer (step S110). The via pad patterns may constitute a portion of an inner layer of a PCB. Also, the via pad connecting pattern may electrically connect the different via pad patterns to each other. A supporting substrate including hole patterns that correspond to the via pad patterns and the via pad connecting patterns may be provided (step S120). At this time, each of the hole patterns may have a sufficient size to accommodate the via pad patterns and the via pad connecting pattern therein. The supporting substrate may constitute a part of the inner layer of the PCB through subsequent processes. A second intermediate substrate including an insulating layer may be provided (step S130). The first intermediate substrate, the supporting substrate, and the second intermediate substrate may be combined with each other (step S140). For example, the first intermediate substrate, the supporting substrate, and the second intermediated substrate may be sequentially arranged so that the via pad patterns and the via pad connecting patterns are disposed in the hole patterns in a plan view. Subsequently, the first intermediate substrate and the supporting substrate may be pressed down on the second intermediated substrate. At this time, the insulating core layer may contact the insulating layer so that the via pad patterns, the via pad connecting patterns and the supporting substrate are buried between the insulating core layer and the insulating layer. As a result, the via pad patterns and the via pad connecting patterns may be disposed inside the hole patterns, and the via pad patterns and the via pad connecting patterns may be disposed to be spaced apart from the supporting substrate at the same level.

Although not illustrated in FIG. 4, via holes that penetrate at least one of the insulating core layer and the insulating layer may then be formed to expose the via pad patterns. Subsequently, via plugs filling the via holes may be formed. Next, circuit patterns may be formed on at least one of the insulating core layer and the insulating layer. At least a part of each of the circuit patterns may be electrically connected to one of the via plugs. Further, a resist pattern layer may be formed on at least one of the insulating core layer and the insulating layer. The resist pattern layer may be formed to selectively expose the circuit patterns.

FIGS. 5 to 13 are cross-sectional views illustrating representations of examples of methods of fabricating a PCB according to an embodiment.

Figure 5:
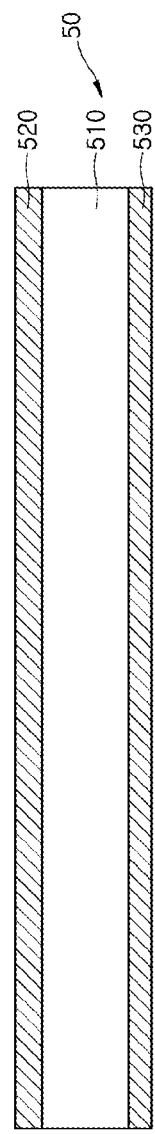
FIGS. 5 to 13 are cross-sectional views illustrating representations of examples of methods of fabricating a PCB according to an embodiment.

Referring to FIG. 5, a substrate 50 may be provided. The substrate 50 may include an insulating core layer 510 and first and second copper foil layers 520 and 530 disposed on both surfaces of the insulating core layer 510.

Figure 6:
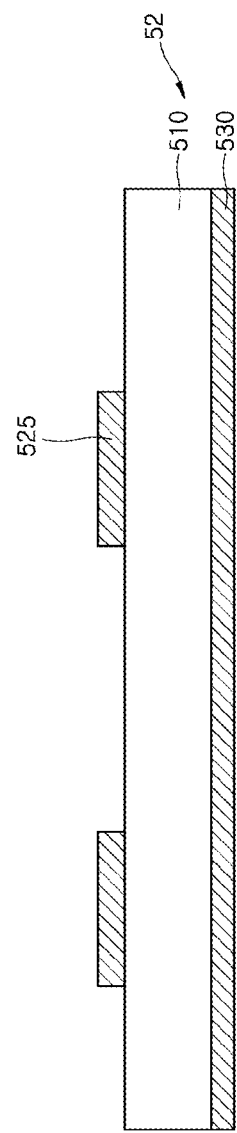

Referring to FIG. 6, the first copper foil layer 520 may be patterned to form via pad patterns 525 and a via pad connecting pattern (not illustrated) on a surface of the insulating core layer 510. Each of the via pad patterns 525 may be, for example, a pad having substantially a circular shape or a polygonal shape, and the via pad connecting pattern may be, for example, a line pattern having a predetermined width or a regional pattern of an arbitrary shape. Thus, the via pad patterns 525 and the via pad connecting pattern may be formed on a surface of the insulating core layer 510, and the second copper foil layer 530 may be disposed on the other surface of the insulating core layer 510 opposite to the via pad patterns 525. The via pad patterns 525, the via pad connecting pattern, insulating core layer 510 and the second copper foil layer 530 may constitute a first intermediate substrate 52. In some other embodiments, the via pad patterns 525 may be formed using a plating process employing the first copper foil layer 520 as a plating seed layer. In this example, the plating process may be performed using a semi-additive process (SAP) or a modified semi-additive process (MSAP) with a resist pattern.

Figure 7:
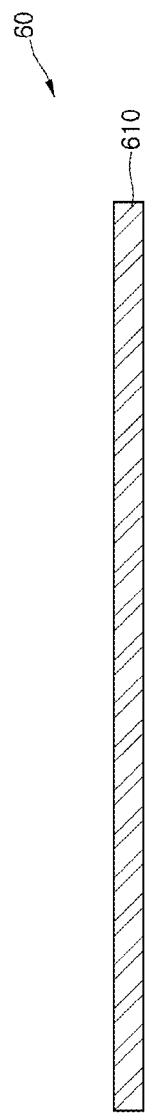

Referring to FIG. 7, a supporting substrate 60 is provided. The supporting substrate 60 may be a plate member 610 including a material which is stiffer than the via pad patterns 525. The plate member 610 may include a metal material or an alloy material. For example, if the via pad pattern 525 is a copper layer, the plate member 610 may include an alloy steel material such as, for example but not limited to, a carbon steel material or a stainless steel material. Alternatively, the plate member 610 may include, for example but not limited to, a metal oxide-based ceramic material. In some other embodiments, if the via pad pattern 525 is a copper layer, the plate member 610 may also include a copper layer. However, in such an example, the via pad pattern 525 may be thicker than the via pad patterns 525.

Figure 8:
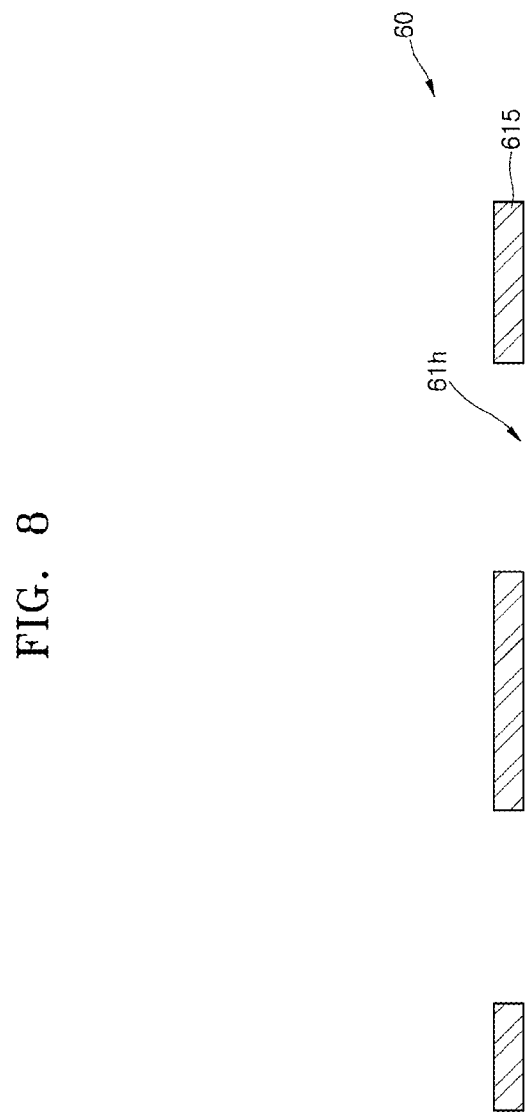

Referring to FIG. 8, the plate member 610 may patterned to form hole patterns 61h penetrating the plate member 610. As a result, the patterned plate member 610 may correspond to a supporting pattern 615, and the supporting substrate 60 may include the supporting pattern 615 and the hole patterns 61h. Each of the hole patterns 61h may be formed to accommodate each via pad pattern 525 and the via pad connecting the pattern therein. The supporting pattern 615 may include a regional pattern inside a closed loop of an arbitrary shape, a stripe pattern having a predetermined width, or a grid pattern. The supporting pattern 615 may be formed to have substantially the same feature as the supporting pattern 211 described with reference to FIGS. 3A to 3C.

Figure 9:
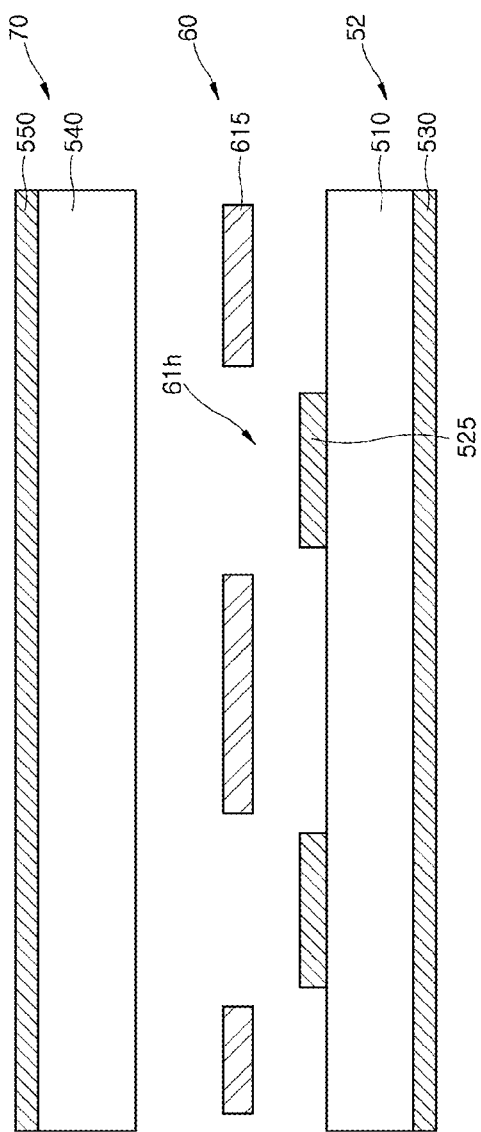

Referring to FIG. 9, the supporting substrate 60 may be arranged and disposed over the first intermediate substrate 52 so that the via pad patterns 525 and the via pad connecting pattern vertically overlap with the hole patterns 61h. A second intermediate substrate 70 including an insulating layer 540 and a third copper foil layer 550 stacked on a surface of the insulating layer 540 may be provided. Then, the second intermediate substrate 70 may be aligned and disposed over the supporting substrate 60.

Figure 10:
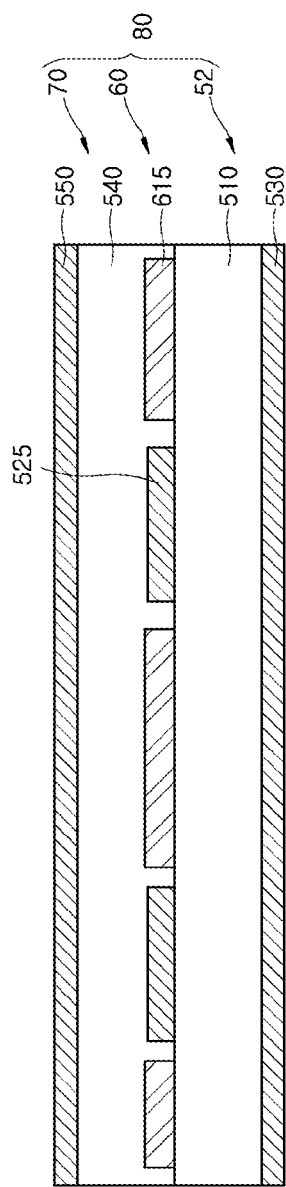

Referring to FIG. 10, the first intermediate substrate 52, the supporting substrate 60 and the second intermediate substrate 70 may be combined with each other to form a stacked structure 80. The combining process may be performed so that the via pad patterns 525, the via pad connecting pattern and the supporting substrate 60 are buried between the insulating layer 540 and the insulating core layer 510. As a result, the via pad patterns 525 and the via pad connecting pattern may be disposed on the insulating core layer 510 inside the hole patterns 61h. The via pad patterns 525 and the via pad connecting pattern may be disposed to be spaced apart from the supporting pattern 615 on a surface of the insulating core layer 510.

Figure 11:
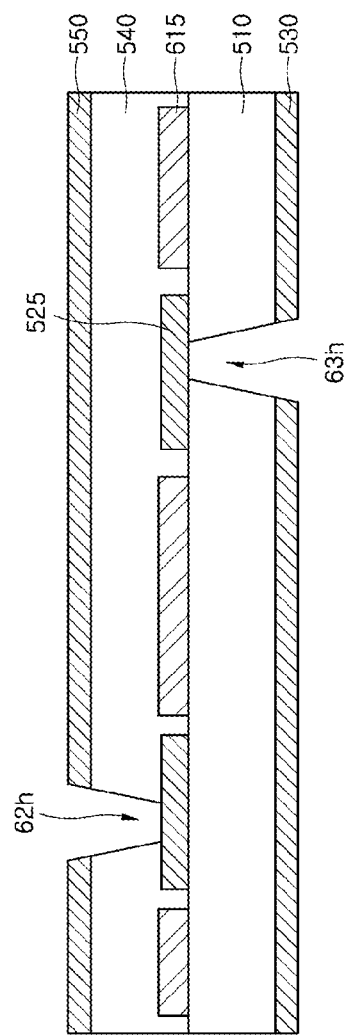

Referring to FIG. 11, the third copper foil layer 550 and the insulating layer 540 may be patterned to form a first via hole 62h exposing a surface of one of the via pad patterns 525. Similarly, the second copper foil layer 530 and the insulating core layer 510 may be patterned to form a second via hole 63h exposing a surface of the other one of the via pad patterns 525. The first and second via holes 62h and 63h may be formed using at least one of, for example but not limited to, a mechanical processing method, a laser processing method, and a chemical etching method.

Figure 12:
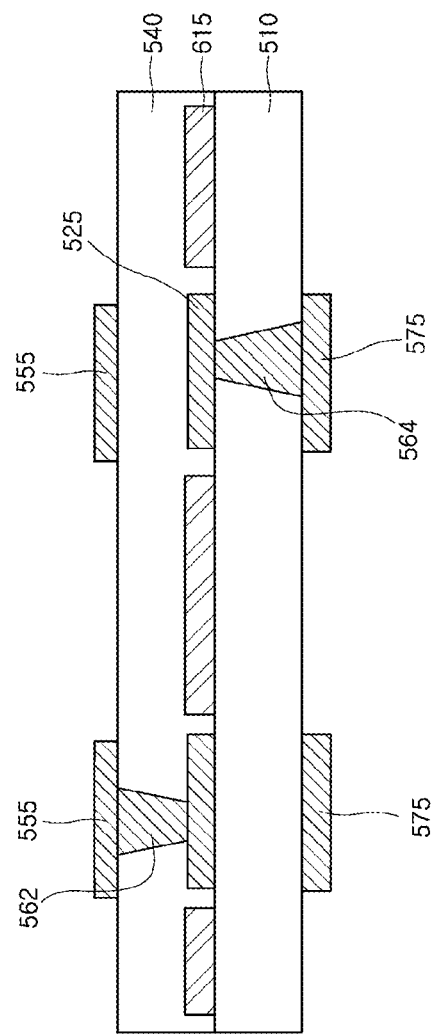

Referring to FIG. 12, a first via plug 562 filling the first via hole 62h may be formed, and first circuit patterns 555 may be formed on a surface of the insulating layer 540. At least a part of any one of the first circuit patterns 555 may be connected to a first via plug 562. Similarly, a second via plug 564 filling the second via hole 63h may be formed, and second circuit patterns 575 may be formed on a surface of the insulating core layer 510. At least a part of any one of the second circuit patterns 575 may be connected to a second via plug 564. The first and second via plugs 562 and 564 and the first and second circuit patterns 555 and 575 may be formed using at least one of, for example but not limited to, an electroplating method and a chemical plating method. For example, the first and second via plugs 562 and 564 and the first and second circuit patterns 555 and 575 may be formed by using an SAP, an MSAP, or the like.

Figure 13:
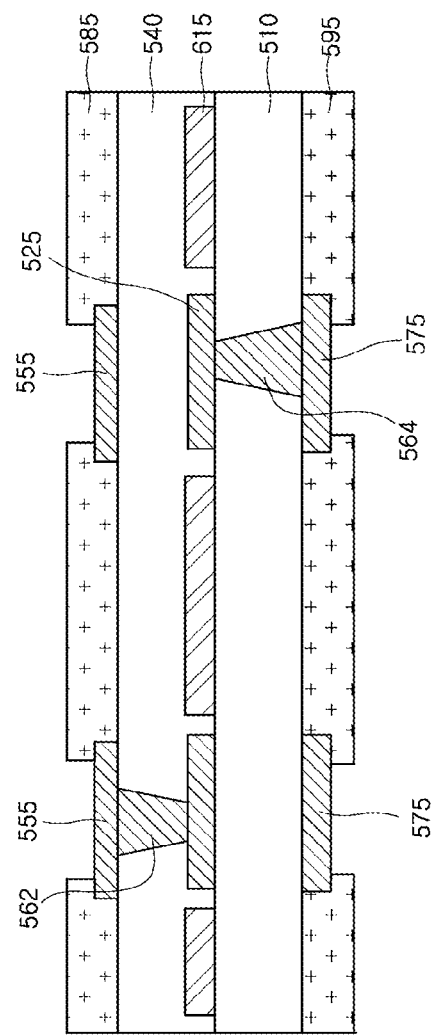

Referring to FIG. 13, a first resist pattern layer 585 selectively exposing the first circuit patterns 555 may be formed on a surface of the insulating layer 540. Similarly, a second resist pattern layer 595 selectively exposing the second circuit patterns 575 may be formed on a surface of the insulating core layer 510. The first and second circuit patterns 555 and 575 exposed by the first and second resist pattern layers 585 and 595 may act as conductive pads that may be connected to a semiconductor chip or a semiconductor package mounted on the PCB or may act as ball lands that may be connected to an external system.

The PCB according to an embodiment may be fabricated by the above-described processes. The PCB fabricated by the above-described processes may have substantially the same configuration as the PCB 200 described with reference to FIG. 2.

The PCB described above may be used in fabrication of semiconductor packages. Also, the semiconductor packages fabricated using the PCB may be employed in various electronic systems.

Figure 14:
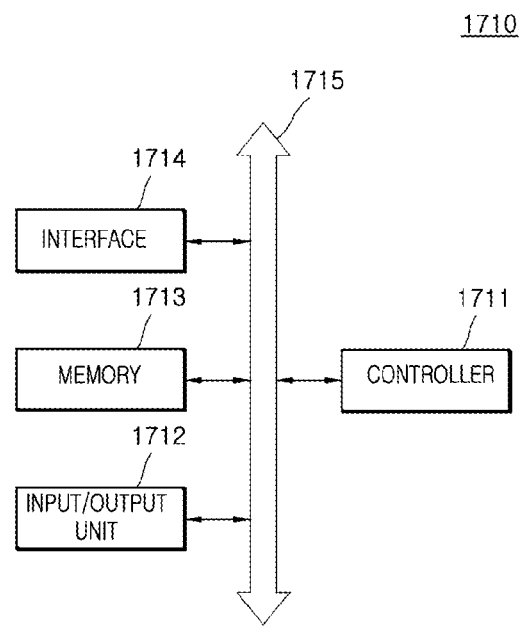
FIG. 14 is a block diagram illustrating a representation of an example of an electronic system including the PCB in accordance with the various embodiments.

FIG. 14 is a block diagram illustrating a representation of an example of an electronic system including at least one of the PCBs in accordance with the various embodiments.

Referring to FIG. 14, the semiconductor package fabricated using the PCB according to an embodiment may be applied to an electronic system 1710. The electronic system 1710 may include a controller 1711, an input/output unit 1712, and a memory 1713. The controller 1711, the input/output unit 1712 and the memory 1713 may be coupled with one another through a bus 1715 providing a path through which data are transmitted.

For example but not limited to, the controller 1711 may include at least any one of at least one microprocessor, at least one digital signal processor, at least one microcontroller, and logic devices capable of performing the same functions as these components. At least one of the controller 1711 and the memory 1713 may include the semiconductor package fabricated using the PCB. The input/output unit 1712 may include at least one selected among a keypad, a keyboard, a display device, a touch screen and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic system 1710 may stably store a large amount of data in a flash memory system. The memory 1713 may include at least any one memory device to which the packaging technology of the embodiments of the present disclosure is applied.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 15:
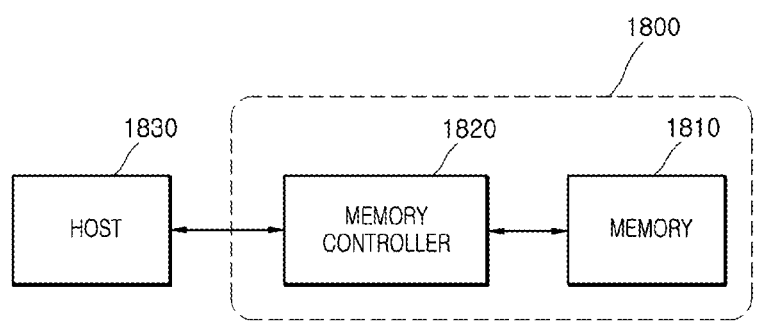
FIG. 15 is a block diagram illustrating a representation of an example of an electronic system including the PCB in accordance with the various embodiments.

FIG. 15 is a block diagram illustrating a representation of an example of an electronic system including at least one of the PCBs in accordance with the various embodiments.

Referring to FIG. 15, the semiconductor package fabricated using the PCB may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

The embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A printed circuit board (PCB) comprising:
    an inner layer including a supporting pattern and via pad patterns, the supporting pattern and the via pad patterns spaced apart from each other;
    an outer layer disposed over and below the inner layer and including a circuit pattern layer; and
    a via plug connecting the circuit pattern layer to any one of the via pad patterns,
    wherein the supporting pattern is stiffer than the via pad patterns, and
    wherein at least two of the via pad patterns are electrically connected to each other by a via pad connecting pattern located at substantially the same level as the via pad patterns.

2. The printed circuit board of claim 1, wherein the supporting pattern and the via pad patterns are disposed to be electrically insulated from each other while being located on substantially the same plane.

3. The printed circuit board of claim 1, wherein the supporting pattern includes a different material from the via pad patterns.

4. The printed circuit board of claim 1, wherein the supporting pattern is thicker than the via pad patterns.

5. The printed circuit board of claim 1, further comprising an interlayer dielectric layer disposed between the inner layer and the outer layer.

6. The printed circuit board of claim 5, wherein the interlayer dielectric layer is disposed between the via pad patterns and the supporting pattern.

7. The printed circuit board of claim 1,
    wherein the supporting pattern is configured to form at least one regional pattern, having a predetermined width, within a closed loop of an arbitrary shape and including a stripe pattern, and
    wherein the supporting pattern is configured to form a grid pattern within the regional pattern.

8. The printed circuit board of claim 7,
    wherein a perimeter of the via pad patterns are surrounded by the interlayer dielectric layer and a perimeter of the interlayer dielectric layer is surrounded by the stripe pattern,
    wherein a via pad pattern is coupled to another via pad pattern through a via pad connecting pattern, and
    wherein the via pad pattern coupled to the another via pad pattern through the via pad connecting pattern form a perimeter surrounded by the interlayer dielectric layer and the perimeter of the interlayer dielectric layer is surrounded by the stripe pattern.

9. The printed circuit board of claim 1,
    wherein the PCB includes at least one unit substrate, and
    wherein the supporting pattern is disposed to surround edges of the at least one unit substrate.

10. The printed circuit board of claim 9,
    wherein a perimeter of each of the unit substrates are surrounded by a frame portion.

11. The printed circuit board of claim 1, further comprising:
    an interlayer dielectric layer disposed between the inner layer and the outer layer; and
    a resist pattern layer disposed on the interlayer dielectric layers and configured to expose portions of the outer layer.

* * * * *

UNITED STATES PATENT AND TRADEMARK OFFICE
CERTIFICATE OF CORRECTION

Page 1 of 1

PATENT NO.         : 9,565,763 B2
APPLICATION NO.    : 14/885318
DATED              : February 7, 2017
INVENTOR(S)        : Jong Hyun Nam It is certified that error appears in the above-identified patent and that said Letters Patent is hereby corrected as shown below:

Column 10, Line 16 should read:
7. The printed circuit board of claim 6,
wherein the supporting pattern is configured to form at least one regional pattern, having a predetermined width, within a closed loop of an arbitrary shape and including a stripe pattern, and wherein the supporting pattern is configured to form a grid pattern within the regional pattern.

Signed and Sealed this
Third Day of September, 2019

Andrei Iancu
*Director of the United States Patent and Trademark Office*